(12) United States Patent (10) Patent No.: US 8,169,813 B2
Nakamura et al. (45) Date of Patent: May 1, 2012

(54) METHOD FOR EVALUATING SRAM MEMORY CELL AND COMPUTER READABLE RECORDING MEDIUM WHICH RECORDS EVALUATION PROGRAM OF SRAM MEMORY CELL

(75) Inventors: Kazuyuki Nakamura, Kitakyushu (JP); Hiroki Koike, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 134 days.

(21) Appl. No.: 12/594,048

(22) PCT Filed: Mar. 10, 2008

(86) PCT No.: PCT/JP2008/054308
§ 371 (c)(1),
(2), (4) Date: Sep. 30, 2009

(87) PCT Pub. No.: WO2008/126548
PCT Pub. Date: Oct. 23, 2008

(65) Prior Publication Data
US 2010/0115352 A1 May 6, 2010

(30) Foreign Application Priority Data

Mar. 31, 2007 (JP) .................................. 2007-095928

(51) Int. Cl.
*G11C 11/00* (2006.01)
(52) U.S. Cl. ........................ 365/154; 365/190; 365/201
(58) Field of Classification Search .................. 365/154, 365/156, 190, 201; 714/718
See application file for complete search history.

(56) References Cited

U.S. PATENT DOCUMENTS 7,099,182 B2 8/2006 Ohtake et al.
7,200,057 B2 4/2007 Pineda de Gyvez et al.

FOREIGN PATENT DOCUMENTS

| JP | 2-841665 | 12/1998 |
|---|---|---|
| JP | 2005-310242 | 11/2005 |
| JP | 2006-134477 | 5/2006 |
| JP | 2006-520511 | 9/2006 |

OTHER PUBLICATIONS

Nov. 9, 2006 "Analytical Modeling of SRAM Dynamic Stability." B. Zhang et al. pp. 315-322.
Sep. 18, 2005 "Programmable Techniques for Cell Stability Test and Debug in Embedded SRAMs." A. Pavlov et al. Custom Integrated Circuits Conference. pp. 436-439.

*Primary Examiner* — Hoai V Ho
*Assistant Examiner* — Kretelia Graham
(74) *Attorney, Agent, or Firm* — Jordan and Hamburg LLP

(57) ABSTRACT

A method for evaluating an SRAM memory cell in which the time required for designing the SRAM memory cell can be shortened by evaluating static noise margin in a shortened time. A recording medium which records an evaluation program is also provided. The coordinate conversion which rotates the coordinate axis by 45 degrees is applied to the input/output characteristic data of a first inverter of the SRAM memory cell, and the first proximity curve function is specified by fitting the input/output characteristic data of the first inverter to the proximity curve. The coordinate conversion which rotates the coordinate axis by 45 degrees is applied to the input/output characteristic data of a second inverter of the SRAM memory cell, and the second proximity curve function is specified by fitting the input/output characteristic data of the second inverter to the proximity curve. A third proximity curve function which is a function generated by mirror-inverting the second proximity curve function with respect to the Y axis is specified, and a static noise margin is specified based on an extremal value of a difference curve function which is the difference between the first proximity curve function and the third proximity curve function.

18 Claims, 20 Drawing Sheets

METHOD FOR EVALUATING SRAM MEMORY CELL AND COMPUTER READABLE RECORDING MEDIUM WHICH RECORDS EVALUATION PROGRAM OF SRAM MEMORY CELL

BACKGROUND OF THE INVENTION

The present invention relates to a method for evaluating an SRAM (Static Random Access Memory) memory cell and a computer readable recording medium which records an evaluation program of the SRAM memory cell.

A semiconductor device which is constituted by forming a transistor on a semiconductor substrate is manufactured by using various microprocessing techniques which are developed to satisfy a demand for miniaturization and high integration, and the miniaturization and high packaging of the semiconductor device have been steadily advancing.

With respect to a semiconductor element such as a transistor which is manufactured using such microprocessing techniques, along with the miniaturization of the semiconductor element, it is not sufficient to simply decrease a size of the semiconductor element while maintaining a similar shape and a new design of semiconductor element becomes necessary. Particularly, as shown in FIG. 15, in an SRAM memory cell which is constituted of a flip-flop circuit having a first inverter 110 and a second inverter 120, it is necessary to adjust the specification of design on each transistor so as to impart a desired writing characteristic and a desired reading characteristic to the SRAM memory cell.

As a method for evaluating the characteristic of the SRAM memory cell, the evaluation of a static noise margin is used (see patent document 1, for example).

The static noise margin is an index which defines how the evaluation of the characteristic of the SRAM memory cell should be made, and the evaluation is made as follows.

An input/output characteristic of the first inverter 110 and an input/output characteristic of the second inverter 120 are obtained by applying a rated power source voltage VDD to word line W and bit lines BL, BL in the SRAM memory cell shown in FIG. 15 respectively. FIG. 16 shows the first inverter by extracting the first inverter from the SRAM memory cell shown in FIG. 15. Here, an output voltage outputted from a node Vs1 when an input voltage ranging from 0V to the rated power source voltage VDD is applied to a node Vs2 is obtained, and is used as the first input/output characteristic data. FIG. 17 shows an example of the first input/output characteristic data 130.

In the same manner, an output voltage outputted from a node Vs2 when an input voltage ranging from 0V to the rated power source voltage VDD is applied to a node Vs1 in the second inverter 120 shown in FIG. 18 is obtained, and is used as the second input/output characteristic data. Next, an X-Y axis conversion is performed by aligning the second input/output characteristic data with an axis of ordinate and an axis of abscissas of the first input/output characteristic data 130 thus newly forming the second input/output characteristic data. FIG. 19 shows an example of the second input/output characteristic data 140 obtained after the X-Y axis conversion.

By overlapping the first input/output characteristic data 130 and the second input/output characteristic data 140 obtained in this manner with each other, as shown in FIG. 20, two regions which are surrounded by a curve of the first input/output characteristic data 130 and a curve of the second input/output characteristic data 140 are formed. Maximum squares which inscribe these regions are respectively drawn, and a length of one side of the smaller square is defined as a static noise margin (SNM).

In the SRAM memory cell, the presence of these two squares is a prerequisite for holding information. The larger the square, that is, the larger a value of the static noise margin, the more stable information the memory cell can hold.

Patent document 1: JP-A-2005-310242

A recent microminiaturized SRAM memory cell is liable to be influenced by various irregularities at the time of the manufacture of the SRAM memory cell along with such microminiaturization thus giving rise to a drawback that characteristics of two inverters which constitute a flip-flop of the SRAM memory cell do not match each other.

The mismatch of characteristic of the inverters lowers the static noise margin value of the SRAM memory cell thus making a normal operation of the SRAM memory cell difficult.

Accordingly, in designing the SRAM memory cell, it is desirable to design the SRAM memory cell by taking various irregularities which may occur at the time of the manufacture of the SRAM memory cell into consideration and, for efficiently performing the evaluation of the various irregularities, there has been a demand for the efficient calculation of the static noise margin.

However, to define the static noise margin, as described previously, it is necessary to specify the maximum square which inscribes the region surrounded by the curve of the first input/output characteristic data and the curve of the second input/output characteristic data and hence, the square is specified by a manual operation. Accordingly, a huge amount of time is necessary for obtaining the static noise margin and hence, it is impossible to design the SRAM memory cell by taking all irregularities in the manufacture of the SRAM memory cell into consideration.

Under such circumstances, inventors of the present invention have made extensive studies for realizing the designing of an SRAM memory cell which enables the evaluation of a static noise margin in a shorter time and is hardly influenced by various irregularities which may occur at the time of the manufacture of the SRAM memory cell, and have completed the present invention.

SUMMARY OF THE INVENTION

To overcome the above-mentioned drawbacks, according to a first aspect of the present invention, there is provided a method for evaluating an SRAM memory cell which stores data by a flip-flop circuit which is constituted of a first inverter and a second inverter, the method for evaluating an SRAM memory cell comprising the steps of: obtaining first input/output characteristic data which is a characteristic of an output voltage for an input voltage in the first inverter; obtaining second input/output characteristic data by applying X-Y axis conversion to characteristic data of an output voltage for an input voltage in the second inverter; generating first rotary converted data by applying coordinate conversion which rotates a coordinate axis by 45 degrees to the first input/output characteristic data; generating second rotary converted data by applying coordinate conversion which rotates a coordinate axis by 45 degrees to the second input/output characteristic data; specifying a first proximity curve function obtained by fitting the first rotary converted data to a proximity curve; specifying a second proximity curve function obtained by fitting the second rotary converted data to a proximity curve; specifying a difference curve function which is the difference between the first proximity curve function and the second proximity curve function; and calculating a static noise margin by specifying a maximum value and a minimum value of the difference curve function, and also by dividing a smaller value out of an absolute value of the minimum value and the maximum value by a square root of 2.

Further, according to a second aspect of the present invention, there is provided a method for evaluating an SRAM memory cell which stores data by a flip-flop circuit which is constituted of a first inverter and a second inverter, the method for evaluating an SRAM memory cell comprising the steps of: obtaining first input/output characteristic data which is a characteristic of an output voltage for an input voltage in the first inverter; obtaining second input/output characteristic data which is a characteristic of an output voltage for an input voltage in the second inverter; generating first rotary converted data by applying coordinate conversion which rotates a coordinate axis by 45 degrees to the first input/output characteristic data; generating second rotary converted data by applying coordinate conversion which rotates a coordinate axis by 45 degrees to the second input/output characteristic data; generating Y-axis inverted data by mirror-inverting the second rotary converted data with respect to a Y axis; specifying a first proximity curve function obtained by fitting the first rotary converted data to a proximity curve; specifying a second proximity curve function obtained by fitting the Y-axis inverted data to a proximity curve; specifying a difference curve function which is the difference between the first proximity curve function and the second proximity curve function; and calculating a static noise margin by specifying a maximum value and a minimum value of the difference curve function, and also by dividing a smaller value out of an absolute value of the minimum value and the maximum value by a square root of 2.

According to a third aspect of the present invention, there is provided a method for evaluating an SRAM memory cell which stores data by a flip-flop circuit which is constituted of a first inverter and a second inverter, the method for evaluating an SRAM memory cell comprising the steps of: obtaining first input/output characteristic data which is a characteristic of an output voltage for an input voltage in the first inverter; obtaining second input/output characteristic data which is a characteristic of an output voltage for an input voltage in the second inverter; generating first rotary converted data by applying coordinate conversion which rotates a coordinate axis by 45 degrees to the first input/output characteristic data; generating second rotary converted data by applying coordinate conversion which rotates a coordinate axis by 45 degrees to the second input/output characteristic data; specifying a first proximity curve function obtained by fitting the first rotary converted data to a proximity curve; specifying a second proximity curve function obtained by fitting the second rotary converted data to a proximity curve; obtaining a third proximity curve function which is a function generated by mirror-inverting the second proximity curve function with respect to the Y axis; specifying a difference curve function which is the difference between the first proximity curve function and the third proximity curve function; and calculating a static noise margin by specifying a maximum value and a minimum value of the difference curve function, and also by dividing a smaller value out of an absolute value of the minimum value and the maximum value by a square root of 2.

In the above-mentioned method for evaluating an SRAM memory cell, the first proximity curve function, the second proximity curve function or the third proximity curve function may be a function expressed by a cubic or more polynomial.

In the above-mentioned method for evaluating an SRAM memory cell, the first proximity curve function, the second proximity curve function or the third proximity curve function may be a function expressed by a quintic polynomial.

Further, according to a fourth aspect of the present invention, there is provided a computer readable recording medium which records an evaluation program of an SRAM memory cell which stores data by a flip-flop circuit constituted of a first inverter and a second inverter, wherein the evaluation program allows the computer to realize functions of evaluating the SRAM memory cell through the steps of: obtaining first input/output characteristic data which is a characteristic of an output voltage for an input voltage in the first inverter; obtaining second input/output characteristic data by applying X-Y axis conversion to characteristic data of an output voltage for an input voltage in the second inverter; generating first rotary converted data by applying coordinate conversion which rotates a coordinate axis by 45 degrees to the first input/output characteristic data; generating second rotary converted data by applying coordinate conversion which rotates a coordinate axis by 45 degrees to the second input/output characteristic data; specifying a first proximity curve function obtained by fitting the first rotary converted data to a proximity curve; specifying a second proximity curve function obtained by fitting the second rotary converted data to a proximity curve; specifying a difference curve function which is the difference between the first proximity curve function and the second proximity curve function; and calculating a static noise margin by specifying a maximum value and a minimum value of the difference curve function, and also by dividing a smaller value out of an absolute value of the minimum value and the maximum value by a square root of 2.

Further, according to a fifth aspect of the present invention, there is provided a computer readable recording medium which records an evaluation program of an SRAM memory cell which stores data by a flip-flop circuit constituted of a first inverter and a second inverter, wherein the evaluation program allows the computer to realize functions of evaluating the SRAM memory cell through the steps of: obtaining first input/output characteristic data which is a characteristic of an output voltage for an input voltage in the first inverter; obtaining second input/output characteristic data which is a characteristic of an output voltage for an input voltage in the second inverter; generating first rotary converted data by applying coordinate conversion which rotates a coordinate axis by 45 degrees to the first input/output characteristic data;

generating second rotary converted data by applying coordinate conversion which rotates a coordinate axis by 45 degrees to the second input/output characteristic data; generating Y-axis inverted data by mirror-inverting the second rotary converted data with respect to a Y axis; specifying a first proximity curve function obtained by fitting the first rotary converted data to a proximity curve; specifying a second proximity curve function obtained by fitting the Y-axis inverted data to a proximity curve; specifying a difference curve function which is the difference between the first proximity curve function and the second proximity curve function; and calculating a static noise margin by specifying a maximum value and a minimum value of the difference curve function, and also by dividing a smaller value out of an absolute value of the minimum value and the maximum value by a square root of 2.

Further, according to a sixth aspect of the present invention, there is provided a computer readable recording medium which records an evaluation program of an SRAM memory cell which stores data by a flip-flop circuit constituted of a first inverter and a second inverter, wherein the evaluation program allows the computer to realize functions of evaluating the SRAM memory cell through the steps of: obtaining first input/output characteristic data which is a characteristic of an output voltage for an input voltage in the first inverter; obtaining second input/output characteristic data which is a characteristic of an output voltage for an input voltage in the second inverter; generating first rotary converted data by applying coordinate conversion which rotates a coordinate axis by 45 degrees to the first input/output characteristic data; generating second rotary converted data by applying coordinate conversion which rotates a coordinate axis by 45 degrees to the second input/output characteristic data; specifying a first proximity curve function obtained by fitting the first rotary converted data to a proximity curve; specifying a second proximity curve function obtained by fitting the second rotary converted data to a proximity curve; specifying a third proximity curve function which is a function generated by mirror-inverting the second proximity curve function with respect to the Y axis; specifying a difference curve function which is the difference between the first proximity curve function and the third proximity curve function; and calculating a static noise margin by specifying a maximum value and a minimum value of the difference curve function, and also by dividing a smaller value out of an absolute value of the minimum value and the maximum value by a square root of 2.

Further, in the above-mentioned computer readable recording medium which records an evaluation program of an SRAM memory cell, the first proximity curve function, the second proximity curve function or the third proximity curve function may be a function expressed by a cubic or more polynomial.

Further, in the above-mentioned computer readable recording medium which records an evaluation program of an SRAM memory cell, the first proximity curve function, the second proximity curve function or the third proximity curve function may be a function expressed by a quintic polynomial.

According to the present invention, the coordinate conversion which rotates the coordinate axis by 45 degrees is applied to the input/output characteristic data of the first inverter of the SRAM memory cell, the first proximity curve function is specified by fitting the rotary converted data to the proximity curve, the coordinate conversion which rotates the coordinate axis by 45 degrees is applied to the X-Y-axis-converted input/output characteristic data of the second inverter of the SRAM memory cell, and the second proximity curve function is specified by fitting the X-Y-axis-converted input/output characteristic data of the second inverter to the proximity curve. Due to such processing, a static noise margin which is defined as "a length of one side of an inscribing square" can be specified by an extremal value of the difference curve function which is the difference between the first proximity curve function and the second proximity curve function.

Accordingly, steps of calculating the static noise margin can be simplified and hence, the static noise margin can be evaluated within a short time thus shortening a time necessary for designing the SRAM memory cell.

DETAILED DESCRIPTION OF THE INVENTION

In the conventional calculation of a static noise margin, it is necessary to estimate "a square which inscribes a predetermined region" and hence, drawing of the square by a manual operation is necessary. A method for evaluating an SRAM memory cell and an evaluation program of an SRAM memory cell according to the present invention are based on a finding that a diagonal line of "a square which inscribes a predetermined region" is a value which is obtained by multiplying a value of a static noise margin by a square root of 2, and the diagonal line assumes the Y-axis direction due to the coordinate conversion which rotates the coordinate axis by 45 degrees. By making use of such finding, the static noise margin can be easily calculated.

That is, the coordinate conversion which rotates the coordinate axis by 45 degrees is applied to input/output characteristic data of a first inverter of the SRAM memory cell, and a first proximity curve function is specified by fitting the input/output characteristic data of a first inverter to a proximity curve. The coordinate conversion which rotates the coordinate axis by 45 degrees is applied to the X-Y axis-converted input/output characteristic data of a second inverter of the SRAM memory cell, and a second proximity curve function is specified by fitting the X-Y axis-converted input/output characteristic data to a proximity curve. A static noise margin can be specified based on an extremal value of a difference curve function which is the difference between the first proximity curve function and the second proximity curve function.

Here, the extremal value of the difference curve function is a value which is obtained by multiplying a value of the static noise margin by a square root of 2. That is, the value of the static noise margin can be calculated by dividing a smaller value between an absolute value of a minimum value and a maximum value out of the maximum value and the minimum value of the difference curve function by the square root of 2.

Accordingly, steps of calculating the static noise margin can be simplified and hence, the evaluation of the static noise margin can be performed within an extremely short time thus shortening time necessary for designing the SRAM memory cell.

Figure 1:
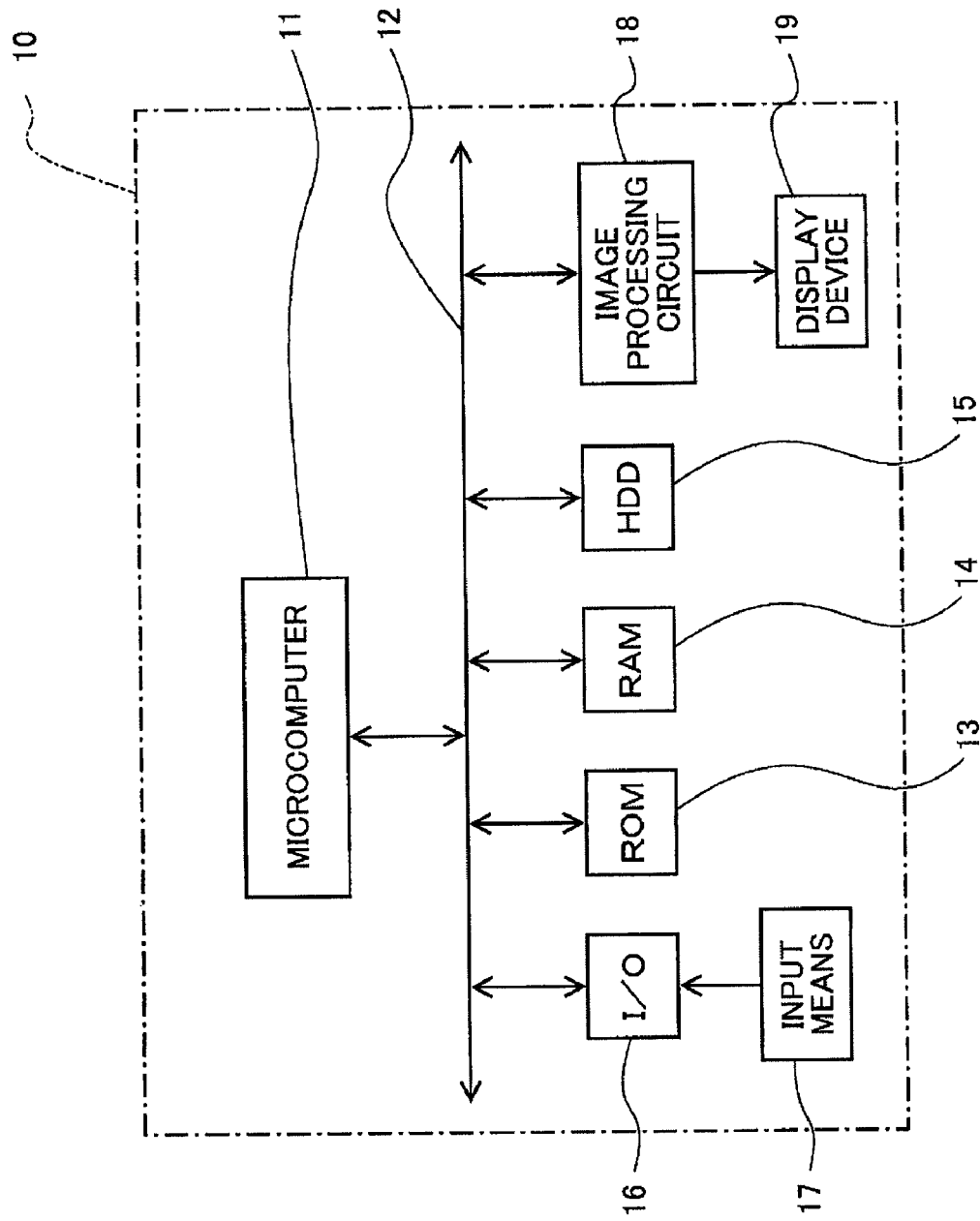
FIG. 1 is an explanatory view of a computer which executes an evaluation program of an SRAM memory cell according to the present invention.

A first specific embodiment of the present invention is explained hereinafter. According to the present invention, as shown in FIG. 1, the static noise margin is calculated using a computer 10 which includes a CPU 11 for executing predetermined arithmetic processing. The CPU 11 is connected to, via a bus 12, a ROM 13 which stores a predetermined program, a RAM 14 which develops the program to be executed or stores predetermined data, and a hard disk device 15 which stores an evaluation program of the SRAM memory cell, a simulation program for generating DC characteristic data of the SRAM memory cell and the like. The CPU 11 can execute predetermined processing. As a recording medium, for example, a CD-ROM, a DVD-ROM, a USB memory or the like in which a computer readable evaluation program is recorded may be used.

Further, to the bus 12 of the computer 10, an input means 17 such as a keyboard, a mouse or a tablet is connected via an input interface circuit 16. Further, to the bus 12 of the computer 10, a display device 19 is connected via an image processing circuit 18 to allow the display device 19 to display a predetermined image.

The evaluation program of the SRAM memory cell according to this embodiment is operated as one subroutine in a design program of the SRAM memory cell stored in the hard disk device 15.

Figure 2:
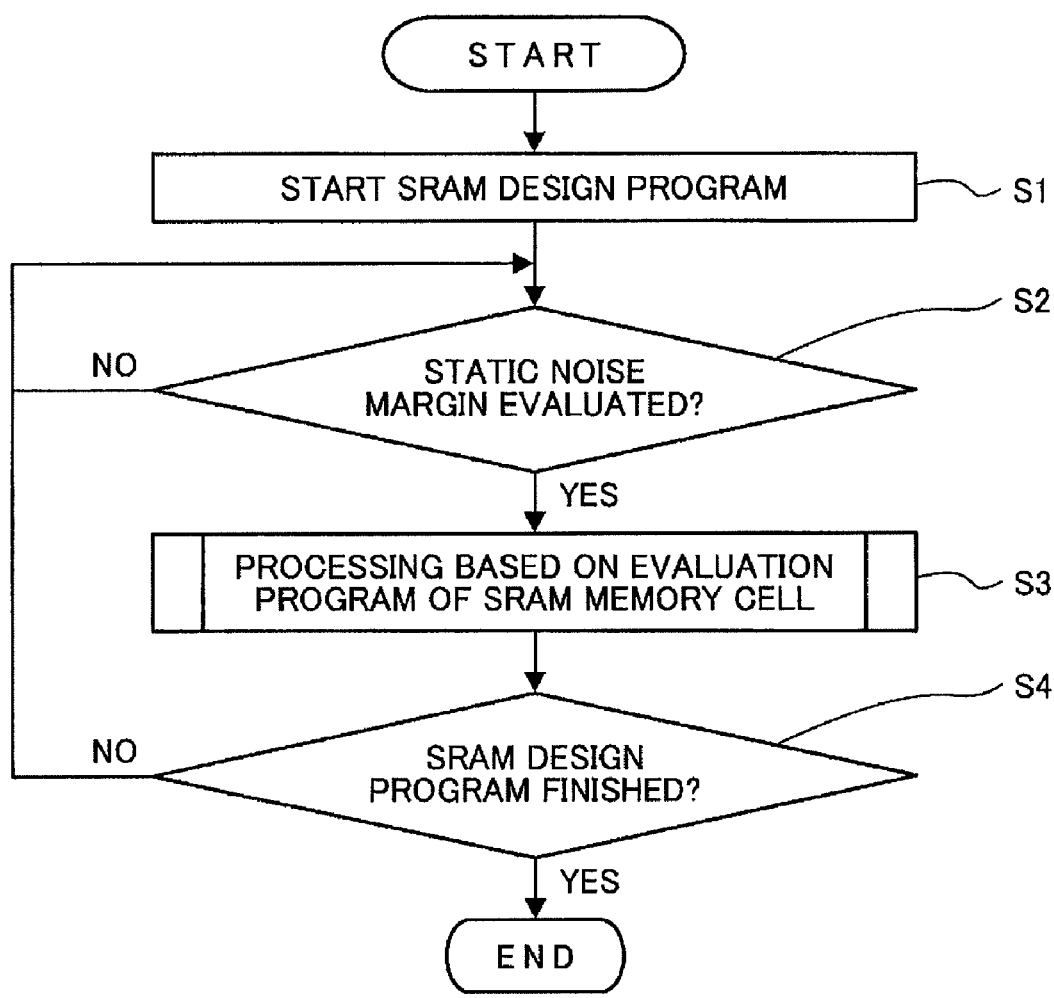
FIG. 2 is a flowchart of a design program of the SRAM memory cell which the computer executes.

That is, in the computer 10, as shown in FIG. 2, based on a start command of a design program of the SRAM memory cell inputted from the input means 17, the design program of the SRAM memory cell is started (step 1) so that a design condition of the SRAM memory cell is inputted.

After starting the design program of the SRAM memory cell, to confirm a margin for various irregularities which occur at the time of the manufacture with respect to the SRAM memory cell to be designed, a "static noise margin evaluation" button switch which is provided on a display screen of the display device 19 is selected by the input means 17 (step S2: YES) so that the computer 10 starts the evaluation program of the SRAM memory cell for executing the evaluation of the SRAM memory cell (step S3). During a period in which the "static noise margin evaluation" button switch is not selected, the computer 10 executes the predetermined processing based on the design program of the SRAM memory cell.

When the evaluation operation of the SRAM memory cell is finished so that the evaluation program of the SRAM memory cell is finished in step S3 but the design program of the SRAM memory cell is not yet finished (step S4: NO), the computer 10 executes the predetermined processing based on the design program of the SRAM memory cell.

The computer 10 executes following processing by starting the evaluation program of the SRAM memory cell in step S3.

Figure 3:
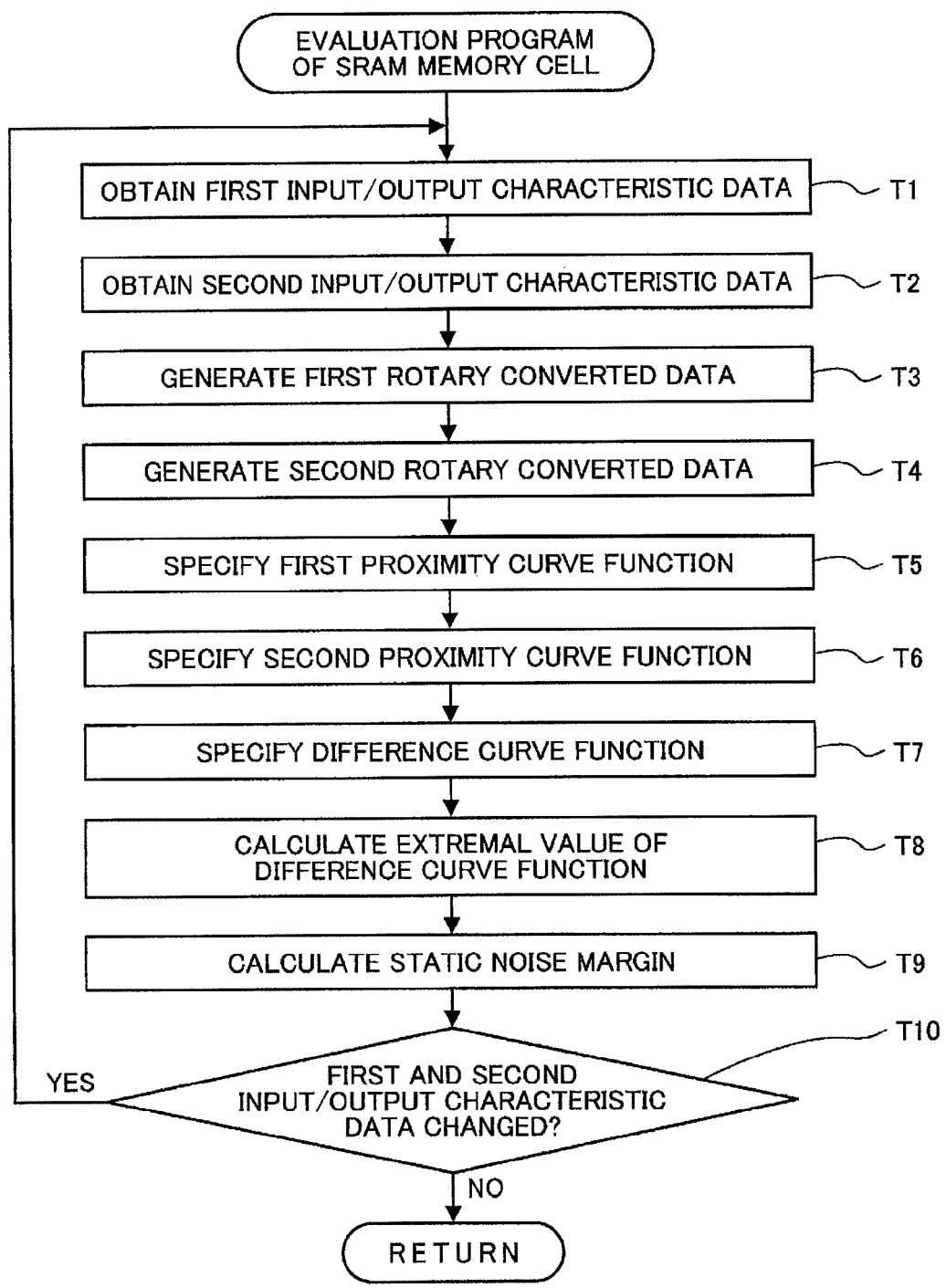
FIG. 3 is a flowchart of an evaluation program of the SRAM memory cell which the computer executes.
Figure 4:
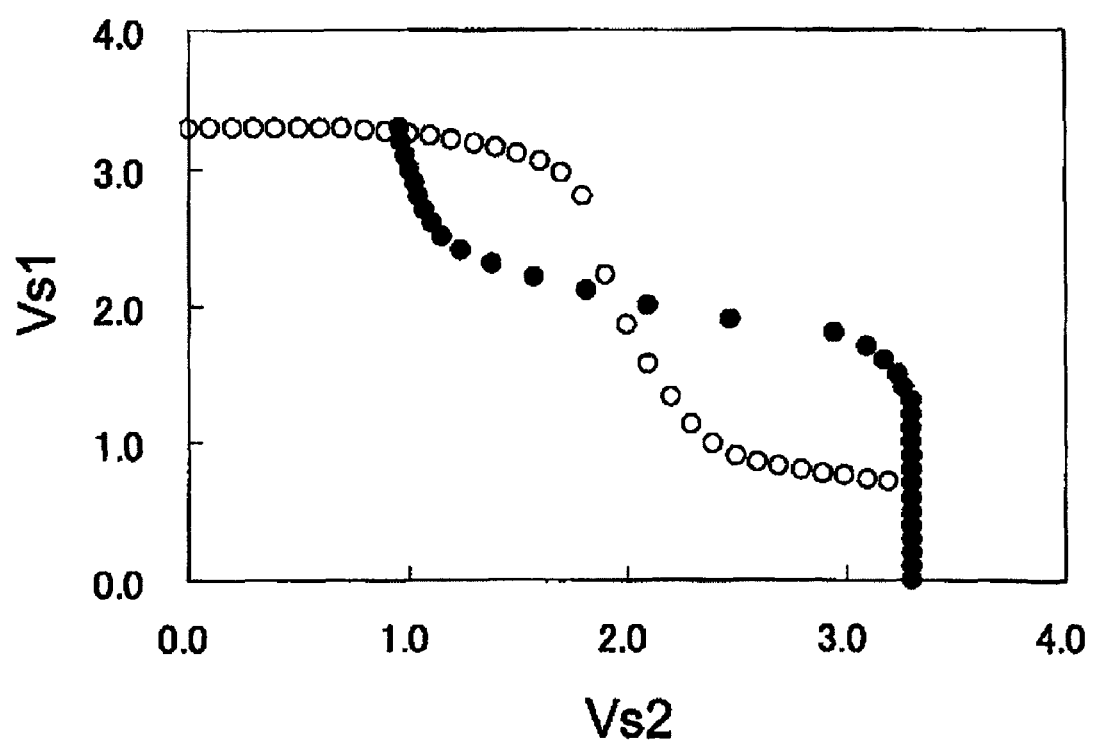
FIG. 4 is an explanatory view of input/output characteristic data of an inverter which constitutes the SRAM memory cell.

That is, in accordance with the execution of the evaluation program of the SRAM memory cell, as shown in FIG. 3, firstly, the computer 10 obtains a characteristic of an output voltage for an input voltage in one inverter out of two inverters which constitute the SRAM memory cell as first input/output characteristic data (step T1 in FIG. 3). An example of the first input/output characteristic data is indicated by white dots in FIG. 4.

The first input/output characteristic data which the computer obtains may be input/output characteristic data preliminarily stored in the RAM 14 or the hard disk device 15, or may be input/output characteristic data inputted by the input means 17 such as a keyboard, or may be input/output characteristic data which is read from a recording medium such as a memory card. Further, the first input/output characteristic data which the computer 10 obtains may be input/output characteristic data obtained by a simulation which is carried out by inputting the design condition of the SRAM memory cell. Still further, the first input/output characteristic data which the computer obtains may be input/output characteristic data obtained by measuring an actual device. This embodiment exemplifies a case where the simulation is carried out by inputting the design condition of the SRAM memory cell at the time of acquiring the first input/output characteristic data, and the input/output characteristic data obtained as a result of the simulation is used.

Next, a characteristic of an output voltage for an input voltage in the other inverter out of two inverters which constitute the SRAM memory cell is subject to the X-Y axis conversion, and the computer 10 obtains the characteristic of the output voltage as second input/output characteristic data (step T2 in FIG. 3). An example of the second input/output characteristic data is indicated by black dots in FIG. 4.

In the same manner as the first input/output characteristic data, the second input/output characteristic data which the computer obtains may also be input/output characteristic data preliminarily stored in the RAM 14 or the hard disk device 15 or may be input/output characteristic data inputted by the input means 17 such as a keyboard, or may be input/output characteristic data which is read from a recording medium such as a memory card. Further, the second input/output characteristic data which the computer obtains may be data obtained by a simulation or data obtained by measuring an actual device. In this embodiment, the simulation is carried out by inputting the design condition of the SRAM memory cell at the time of acquiring the second input/output characteristic data, and the input/output characteristic data obtained as a result of the simulation is used. In carrying out the simulation, the calculation of the first input/output characteristic data and the calculation of the second input/output characteristic data may be performed simultaneously thus acquiring the first input/output characteristic data and the second input/output characteristic data simultaneously.

Figure 5:
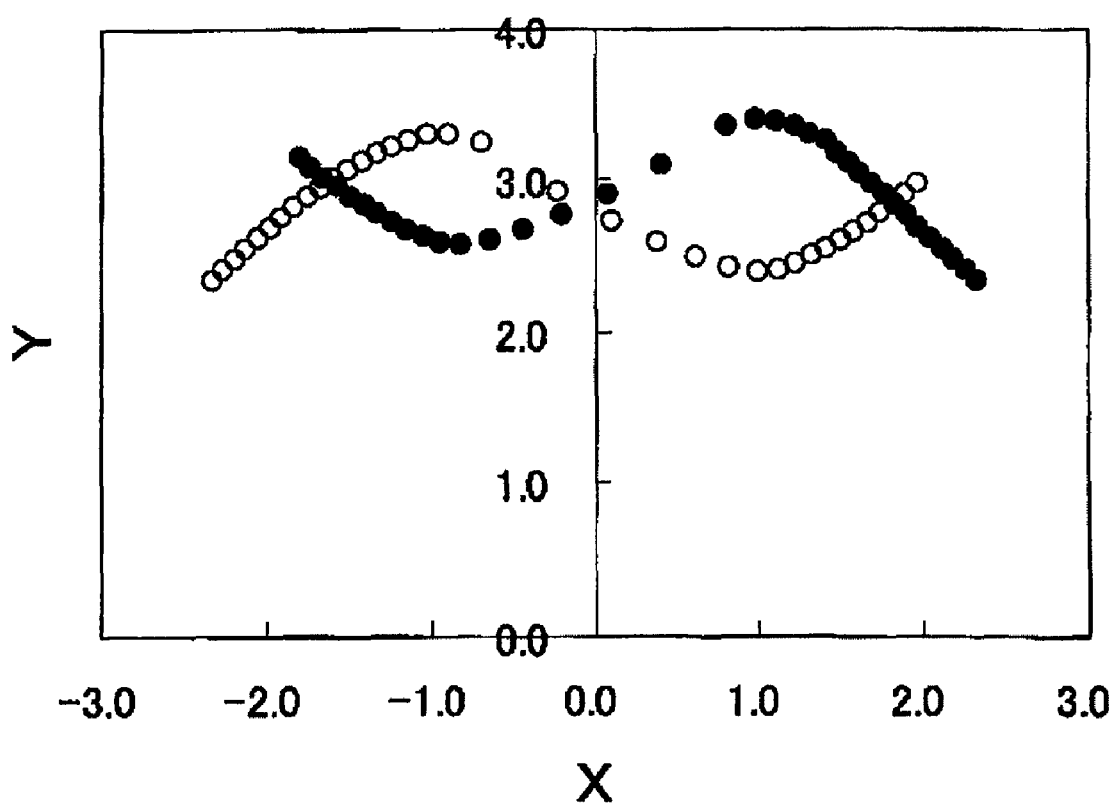
FIG. 5 is an explanatory view of rotary converted data of input/output characteristic data.

Next, by applying the rotary conversion which rotates a coordinate axis by 45 degrees to the respective coordinate point data of the first input/output characteristic data, the computer 10 applies the coordinate conversion which rotates the coordinate axis by 45 degrees to the first input/output characteristic data so as to generate the first rotary converted data (step T3 in FIG. 3). An example of the first rotary converted data is indicated by white dots in FIG. 5.

Here, the rotary conversion is an arithmetic operation which is carried out in accordance with following equations in which coordinates before rotation are set to (x,y), and the coordinates after rotation are set to (X,Y).

$$X = \cos(\pi/4) \cdot x - \sin(\pi/4) \cdot y$$

$$Y = \sin(\pi/4) \cdot x + \cos(\pi/4) \cdot y$$

Next, by applying the rotary conversion which rotates a coordinate axis by 45 degrees to the respective coordinate point data of the second input/output characteristic data, the computer 10 applies the coordinate conversion which rotates the coordinate axis by 45 degrees to the second input/output characteristic data so as to generate the second rotary converted data (step T4 in FIG. 3). Black dots in FIG. 5 indicate the second rotary converted data.

Figure 6:
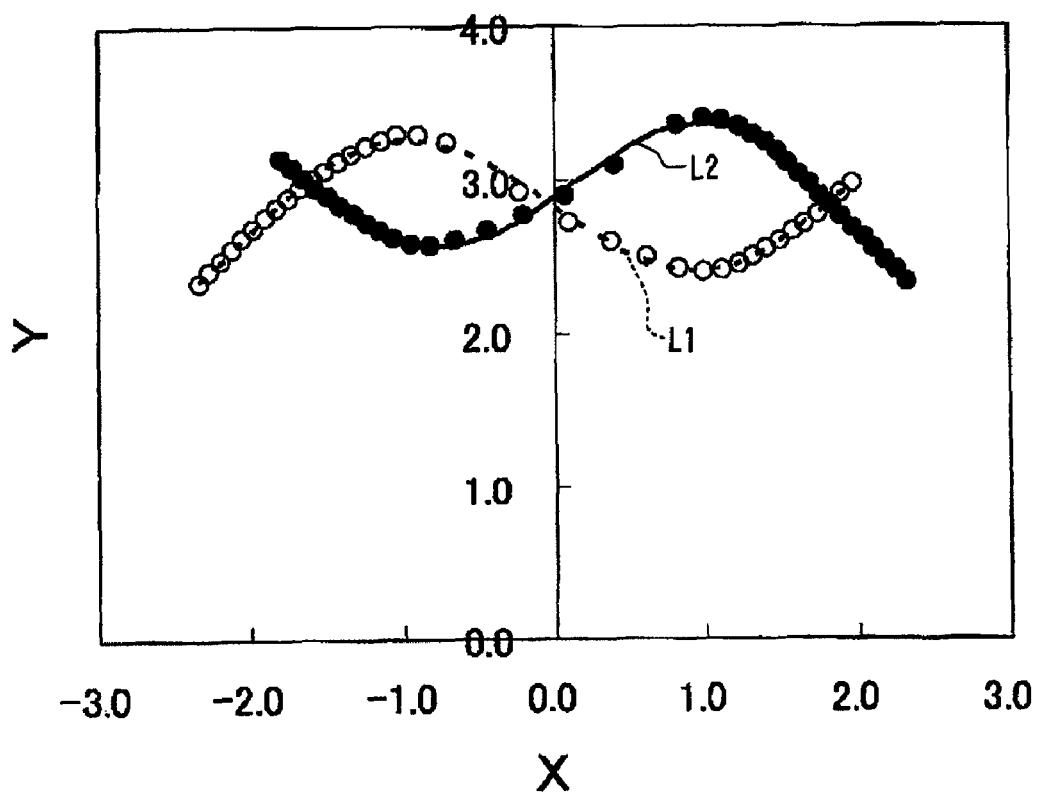
FIG. 6 is an explanatory view of a first proximity curve function and a second proximity curve function.

After generation of respective rotary converted data, as shown in FIG. 6, the computer 10 specifies a first proximity curve function L1 obtained by fitting the first rotary converted data to a proximity curve (step T5 in FIG. 3) and, at the same time, the computer 10 specifies a second proximity curve function L2 obtained by fitting the second rotary converted data to a proximity curve (step T6 in FIG. 3).

The computer 10 executes a proximity curve specifying program for specifying the first proximity curve function L1 and the second proximity curve function L2. In this embodiment, the first proximity curve function L1 and the second proximity curve function L2 are specified by the proximity curve specifying program which uses a least square method.

Here, in the proximity curve specifying program, fitting is performed by assuming the first proximity curve function L1 and the second proximity curve function L2 as a curve expressed by a cubic or more polynomial. By adopting a polynomial as a subject equation for fitting, the calculation executed in step T6 and ensuing steps in FIG. 3 can be simplified. The reason that the order of polynomial is set to cubic or more is that, as can be understood from a shape of the rotary converted data shown in FIG. 5 or FIG. 6, it is desirable to use an equation which has two or more extremal values as an equation for fitting.

Figure 7:
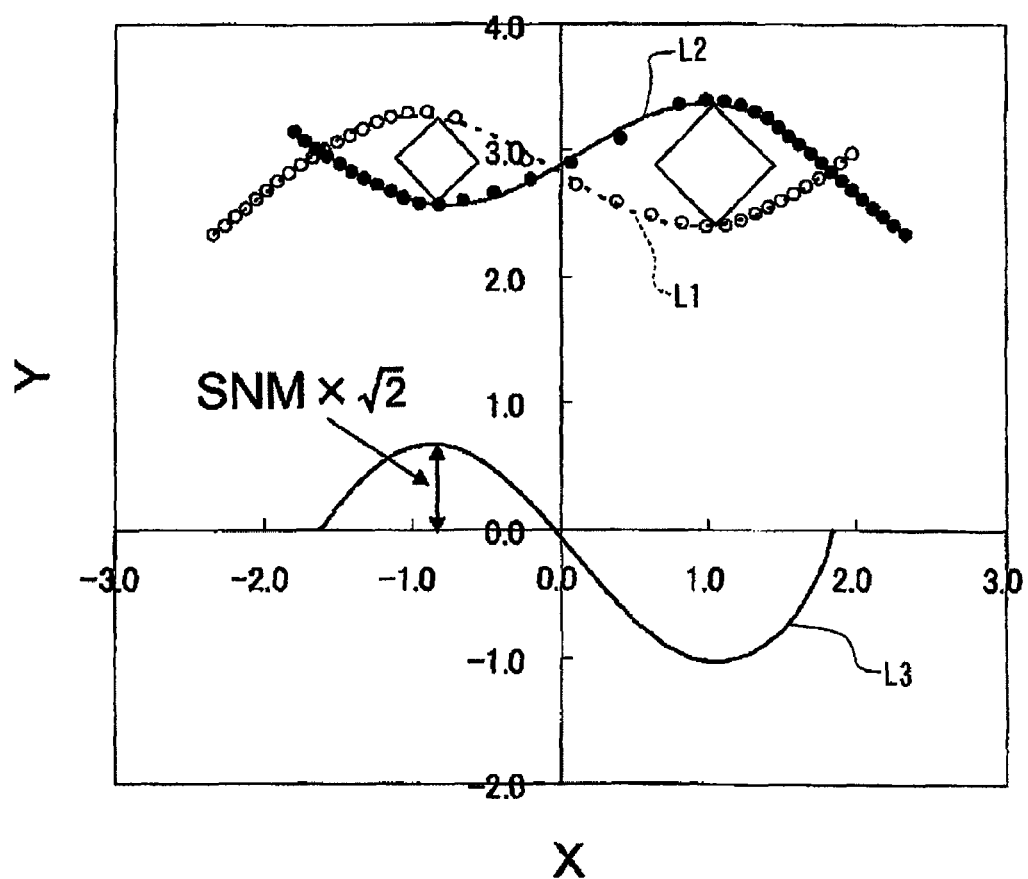
FIG. 7 is an explanatory view of the first proximity curve function, the second proximity curve function and a difference curve function.

After specifying the respective proximity curve functions L1, L2, the computer 10 specifies a difference curve function which is the difference between the first proximity curve function L1 and the second proximity curve function L2 (step T7 in FIG. 3). This difference curve function is indicated by symbol L3 in FIG. 7.

After specifying the difference curve function L3, the computer 10 specifies a maximum value and a minimum value of the difference curve function L3 (step T8 in FIG. 3) and, at the same time, calculates a static noise margin (SNM) by dividing a smaller value out of an absolute value of the minimum value and the maximum value by a square root of 2 (step T9 in FIG. 3). In case of an example shown in FIG. 7, a portion indicated by SNM×(square root symbol) 2 in the drawing corresponds to a value which is (square root of 2) times as large as a target static noise margin value.

Here, in specifying the first proximity curve function L1 and the second proximity curve function L2 in step T5 and step T6 in FIG. 3, when the first proximity curve function L1 and the second proximity curve function L2 are formed of a quintic polynomial, the difference curve function L3 is also formed of a quintic polynomial.

Here, to obtain a maximum value and a minimum value of the difference curve function L3 in step T8 in FIG. 3, an equation where a formula obtained by differentiating the difference curve function is set to 0 is solved. The difference curve function L3 formed of a quintic polynomial becomes a quaternary polynomial by differentiation and hence, the quaternary equation is solved. In general, it is known that a formula of solution exists with respect to a quaternary or lesser-order equation and hence, extremal values can be calculated at a high speed by performing the calculation based on the formula.

In this manner, when the quintic or lesser-order polynomial is used as the difference curve function L3, the equation obtained by differentiating the quintic or lesser-order polynomial becomes a quaternary or lesser-order polynomial and hence, it is possible to use a formula of solution of a polynomial equation in the calculation of extremal values. Accordingly, the numerical value calculation is unnecessary, and it is possible to carry out the subsequent calculation more easily and at a higher speed than a case where fitting is made using other functions.

After calculating the static noise margin in this manner, upon a request for a change of the first input/output characteristic data and the second input/output characteristic data (step T10 in FIG. 3: YES), the computer 10 returns to step T1 in FIG. 3, obtains new first input/output characteristic data and the second input/output characteristic data and calculates a static noise margin. On the other hand, when there is no request for the change of the first input/output characteristic data and the second input/output characteristic data (step T10 in FIG. 3: NO), the computer 10 finishes the evaluation program of the SRAM memory cell and returns to the main routine.

Figure 8:
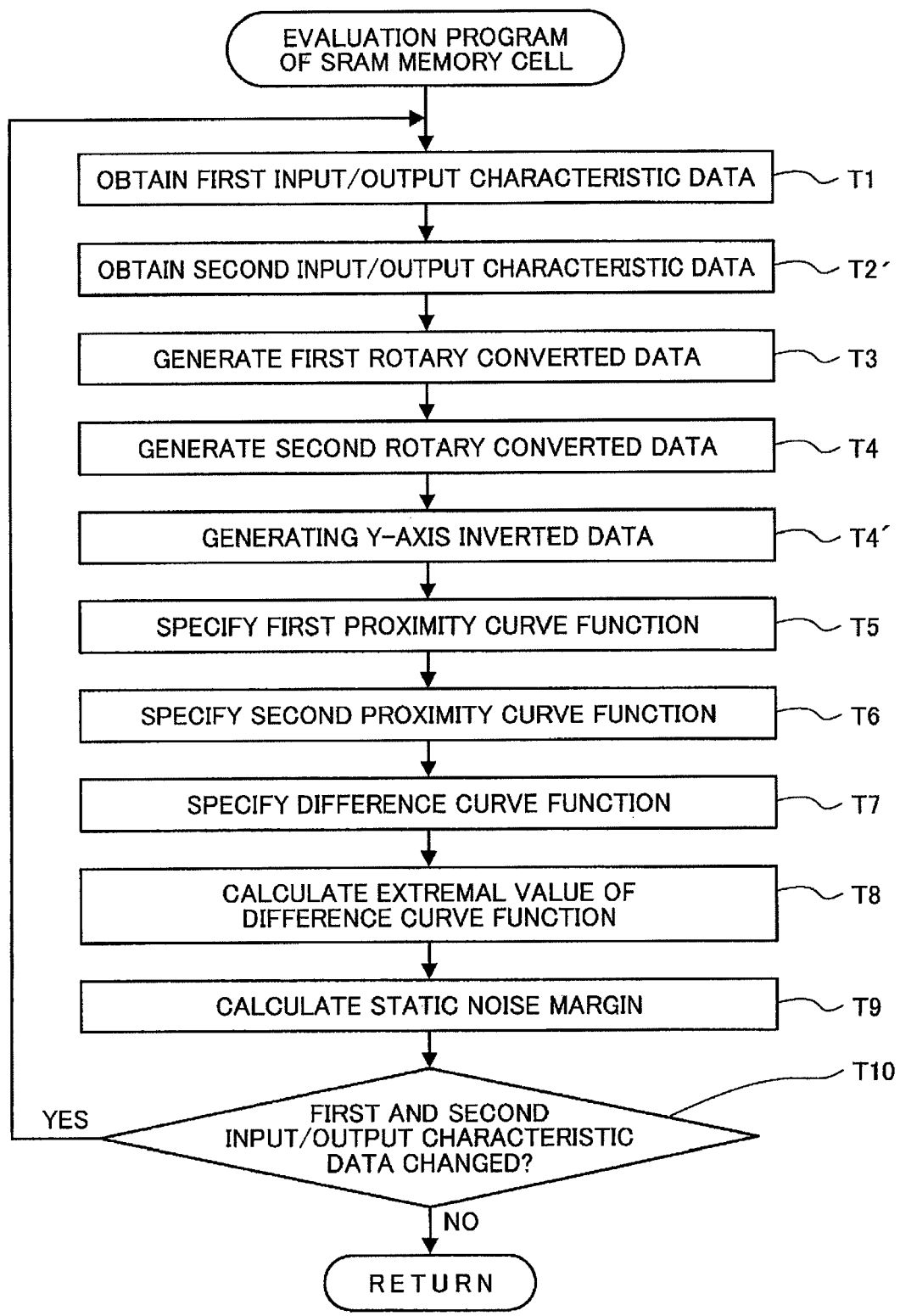
FIG. 8 is a flowchart of the evaluation program of the SRAM memory cell which the computer executes.

A second specific embodiment of the present invention is described hereinafter. A flowchart of the second embodiment corresponding to the flowchart of the first embodiment shown in FIG. 3 is shown in FIG. 8. For the sake of brevity, it is assumed that two inverters which constitute an SRAM used in this embodiment are equal to the inverters used in the explanation of the first embodiment. With respect to terms used for explaining contents such as input/output characteristic data, rotary converted data and the proximity curve functions which are used equivalently in both embodiments, the same terms are used and their explanation of the contents is omitted in the second specific embodiment. Further, steps equal to the steps in the flowchart of the first embodiment are given same symbols.

This embodiment is characterized in that, compared with the first specific embodiment where the second input/output characteristic data is obtained by applying the X-Y axis conversion to the characteristic of the output voltage for the input voltage in the other inverter in step T2 in FIG. 3, the characteristic of the output voltage for the input voltage in the other inverter is directly used as the second input/output characteristic data without applying the X-Y axis conversion to the characteristic of the output voltage.

Here, by mirror-inverting the second rotary converted data with respect to the Y axis in place of the X-Y axis conversion, the Y-axis inverted data is generated.

Figure 9:
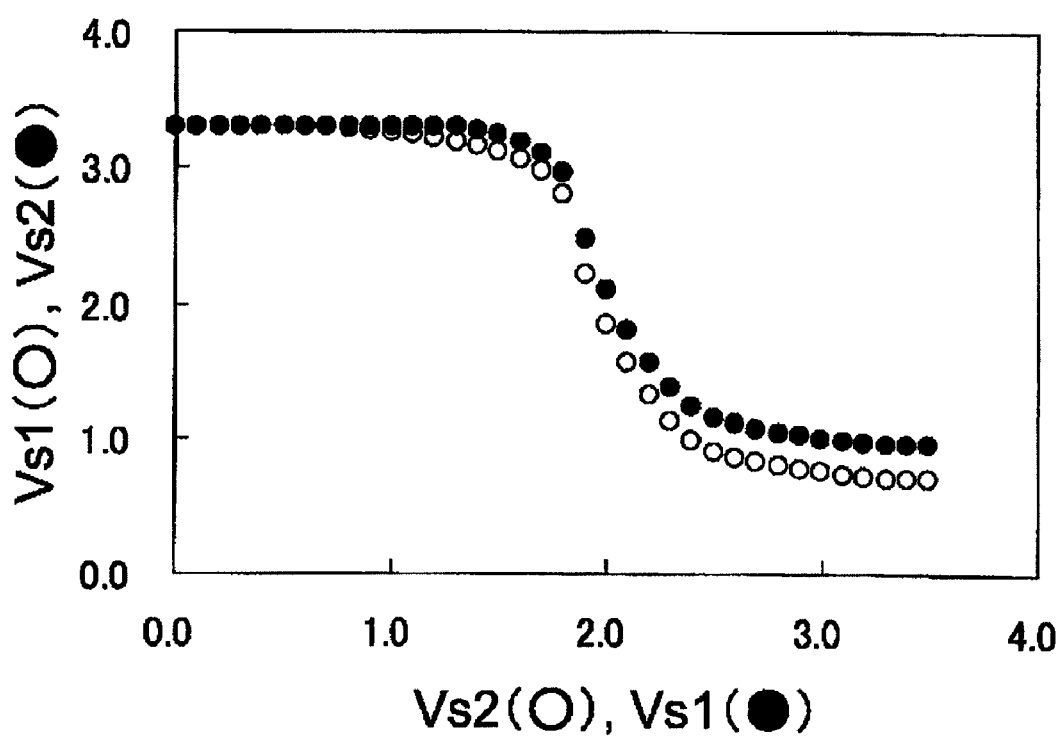
FIG. 9 is an explanatory view of input/output characteristic data of the inverter which constitutes the SRAM memory cell.

First of all, the computer 10 obtains a characteristic of an output voltage for an input voltage in one inverter out of two inverters which constitute the SRAM memory cell as first input/output characteristic data (step T1 in FIG. 8). An example of the first input/output characteristic data is indicated by white dots in FIG. 9. Here, the first input/output characteristic data is equal to the first input/output characteristic data indicated by white dots in FIG. 5.

Next, the computer 10 directly obtains the second input/output characteristic data which is the characteristic of an output voltage for the input voltage in the other inverter out of two inverters which constitute the SRAM memory cell without applying the X-Y axis conversion to the characteristic of the output voltage (step T2' in FIG. 8). Black dots in FIG. 9 indicate the second input/output characteristic data.

Figure 10:
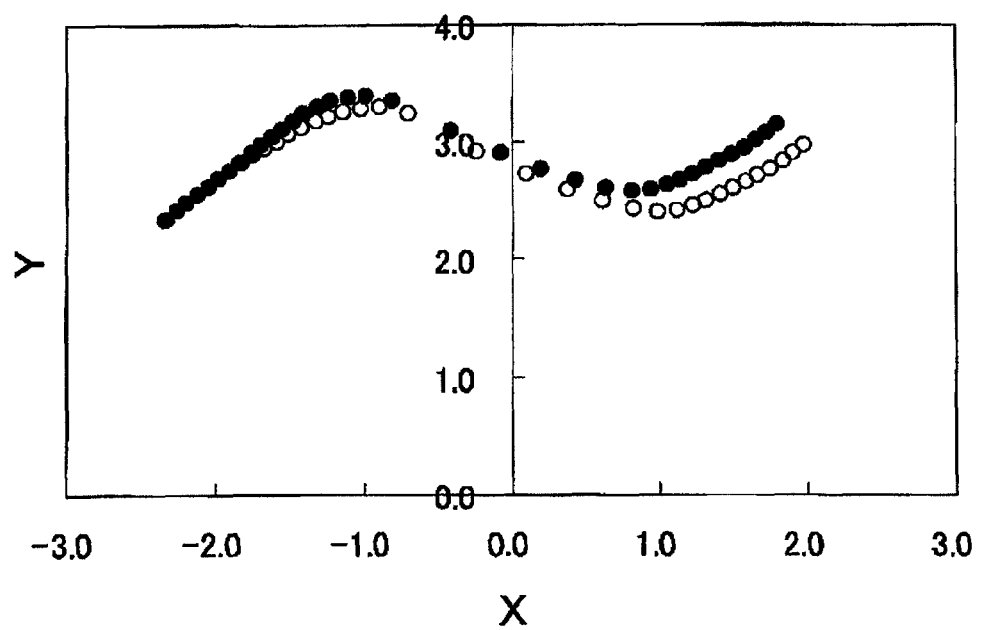
FIG. 10 is an explanatory view of rotary converted data of input/output characteristic data.

Next, by applying the rotary conversion which rotates a coordinate axis by 45 degrees to the respective coordinate point data of the first input/output characteristic data, the computer 10 generates the first rotary converted data by rotating the coordinate axis by 45 degrees with respect to the first input/output characteristic data (step T3 in FIG. 8). White dots in FIG. 10 indicate the first rotary converted data. The rotary conversion is executed by performing the calculation in the same manner as the first embodiment.

Next, by applying the rotary conversion of which rotates a coordinate axis by 45 degrees to the respective coordinate point data of the second input/output characteristic data, the computer 10 generates the second rotary converted data by rotating the coordinate axis by 45 degrees with respect to the second input/output characteristic data (step T4 in FIG. 8). Black dots in FIG. 10 indicate the second rotary converted data.

In the above-mentioned generation of the first rotary converted data and the second rotary converted data, it may be possible to adopt a method where a large number of input/output characteristic data with respect to inverters are preliminarily collected by taking the influence such as characteristic irregularities into consideration, two arbitrary input/output characteristic data are taken out when necessary, and set as the first and second input/output characteristic data, and the first and second rotary converted data are generated based on the first and second input/output characteristic data.

Next, the computer 10 executes the coordinate conversion for mirror-inverting the second rotary converted data with respect to the Y axis thus generating the Y-axis inverted data (step T4' in FIG. 8). On a premise that the original inverters are equal to the inverters used in the first embodiment, a graph where the Y-axis inverted data and the first rotary converted data overlap with each other becomes the same graph as FIG. 5 in the first embodiment.

The respective steps (T5 to T9) up to the calculation of the static noise margin are equal to the corresponding steps of the first embodiment and hence, the explanation of these steps is omitted.

The second embodiment makes use of a finding that an operation in which the X-Y-axis conversion is applied to the input/output characteristic data in step T2 in FIG. 3 and, thereafter, the coordinate conversion which rotates the coordinate axis by 45 degrees is performed in step T4, and an operation in which the coordinate conversion which rotates the coordinate axis by 45 degrees in step T4 in FIG. 8 and, thereafter, the Y-axis mirror inversion is performed in step T4' are equivalent to each other. This can be mathematically proved as follows.

A matrix indicative of mapping which moves a point (x, y) to a point (x', y')=(y, x) by the X-Y axis conversion is expressed as follows.

$$\begin{pmatrix} x' \\ y' \end{pmatrix} = \begin{pmatrix} 0 & 1 \\ 1 & 0 \end{pmatrix}\begin{pmatrix} x \\ y \end{pmatrix} \quad (1)$$

A matrix indicative of mapping which moves a point (x, y) to a point (x', y') by the coordinate conversion which rotates the coordinate axis by 45 degrees is expressed as follows.

$$\begin{pmatrix} x' \\ y' \end{pmatrix} = \begin{pmatrix} \cos\pi/4 & -\sin\pi/4 \\ \sin\pi/4 & \cos\pi/4 \end{pmatrix}\begin{pmatrix} x \\ y \end{pmatrix} \quad (2)$$
$$= \frac{\sqrt{2}}{2}\begin{pmatrix} 1 & -1 \\ 1 & 1 \end{pmatrix}\begin{pmatrix} x \\ y \end{pmatrix}$$

A matrix indicative of mapping which moves a point (x, y) to a point (x', y')=(−x, y) by the Y-axis mirror inversion is expressed as follows.

$$\begin{pmatrix} x' \\ y' \end{pmatrix} = \begin{pmatrix} -1 & 0 \\ 0 & 1 \end{pmatrix}\begin{pmatrix} x \\ y \end{pmatrix} \quad (3)$$

The coordinate conversion which rotates the coordinate axis by 45 degrees after the X-Y axis conversion is expressed by a product of a matrix shown in the equation (1) and a matrix shown in the equation (2).

$$\begin{pmatrix} x' \\ y' \end{pmatrix} = \frac{\sqrt{2}}{2}\begin{pmatrix} 1 & -1 \\ 1 & 1 \end{pmatrix}\begin{pmatrix} 0 & 1 \\ 1 & 0 \end{pmatrix}\begin{pmatrix} x \\ y \end{pmatrix} \quad (4)$$
$$= \frac{\sqrt{2}}{2}\begin{pmatrix} -1 & 1 \\ 1 & 1 \end{pmatrix}\begin{pmatrix} x \\ y \end{pmatrix}$$

On the other hand, the coordinate conversion which performs the Y-axis mirror inversion after performing the coordinate conversion which rotates the coordinate axis by 45 degrees is expressed by a product of a matrix shown in the equation (2) and a matrix shown in the equation (3).

$$\begin{pmatrix} x' \\ y' \end{pmatrix} = \begin{pmatrix} -1 & 0 \\ 0 & 1 \end{pmatrix}\frac{\sqrt{2}}{2}\begin{pmatrix} 1 & -1 \\ 1 & 1 \end{pmatrix}\begin{pmatrix} x \\ y \end{pmatrix} \quad (5)$$
$$= \frac{\sqrt{2}}{2}\begin{pmatrix} -1 & 1 \\ 1 & 1 \end{pmatrix}\begin{pmatrix} x \\ y \end{pmatrix}$$

Since the equation (4) and the equation (5) are equal, it is proved that the above-mentioned operations are equivalent to each other.

A third specific embodiment of the present invention is described hereinafter.

This embodiment is characterized in that, compared to the second specific embodiment where the coordinate conversion which performs mirror inversion with respect to the Y axis is applied to the second rotary converted data in step T4' in FIG. 8 thus generating the Y-axis inverted data, a third proximity curve function is generated by mirror-inverting the second proximity curve function in place of the second rotary converted data.

Then, the difference function is generated using the first rotary converted data and the third proximity curve function obtained by mirror-inverting the second proximity curve function.

Figure 11:
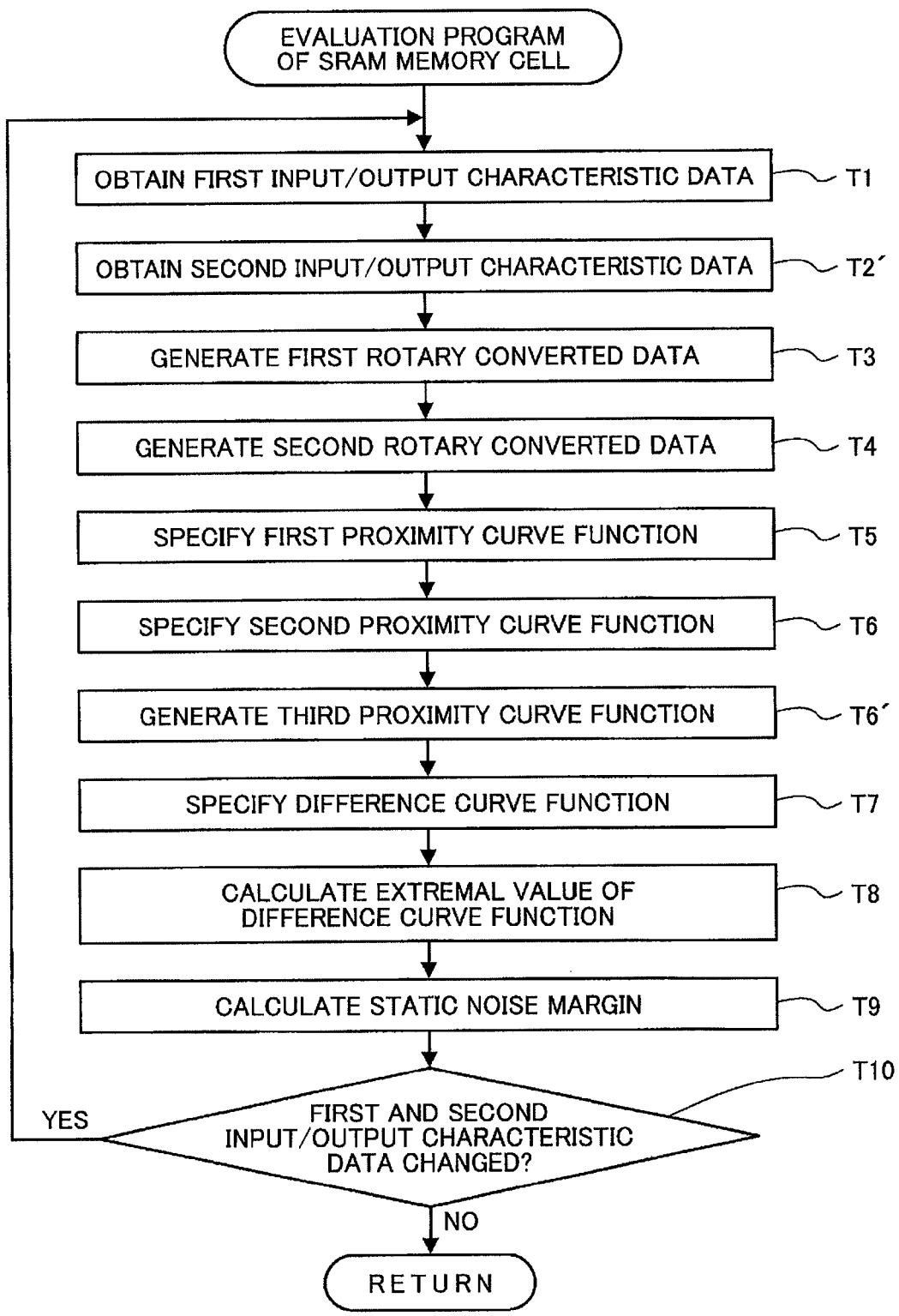
FIG. 11 is a flowchart of the evaluation program of the SRAM memory cell which the computer executes.

FIG. 11 shows a flowchart of the third embodiment corresponding to the flowchart of the first embodiment shown in FIG. 3.

Processing up to step T4 in FIG. 11 advances completely in the same manner as the processing up to step T4 in the flowchart of the second embodiment shown in FIG. 8 and hence, the explanation of such processing is omitted. Also in this embodiment, for the sake of brevity, it is assumed that two inverters which constitute an SRAM used in this embodiment are equal to the inverters used in the explanation of the second embodiment. Further, with respect to terms used for explaining contents such as input/output characteristic data, rotary converted data and the proximity curve functions which are equivalently used both the first and third embodiments, the same terms are used and their explanation of the contents is omitted. Further, steps equal to the steps in the flowchart of the second embodiment are given the same symbols. Here, a graph obtained as a result of step T4 in FIG. 11 is equal to the graph shown in FIG. 10 obtained as the result of step T4 in FIG. 8.

Next, in this embodiment, without performing the coordinate conversion which mirror-inverts the second rotary converted data with respect to the Y axis in step T4' in FIG. 8, the computer 10 specifies the first proximity curve function and the second proximity curve function respectively using a fitting technique substantially equal to the fitting technique used in the first embodiment based on the first rotary converted data and the second rotary converted data (steps T5, T6 in FIG. 11). Also in these steps, it is effective to use a cubic or more polynomial, and more particularly, a quintic polynomial as an equation used for fitting. The first proximity curve function and the second proximity curve function obtained as a result of the fitting are indicated by a broken line (L1) and a solid line (L2) in FIG. 12 respectively.

Figure 12:
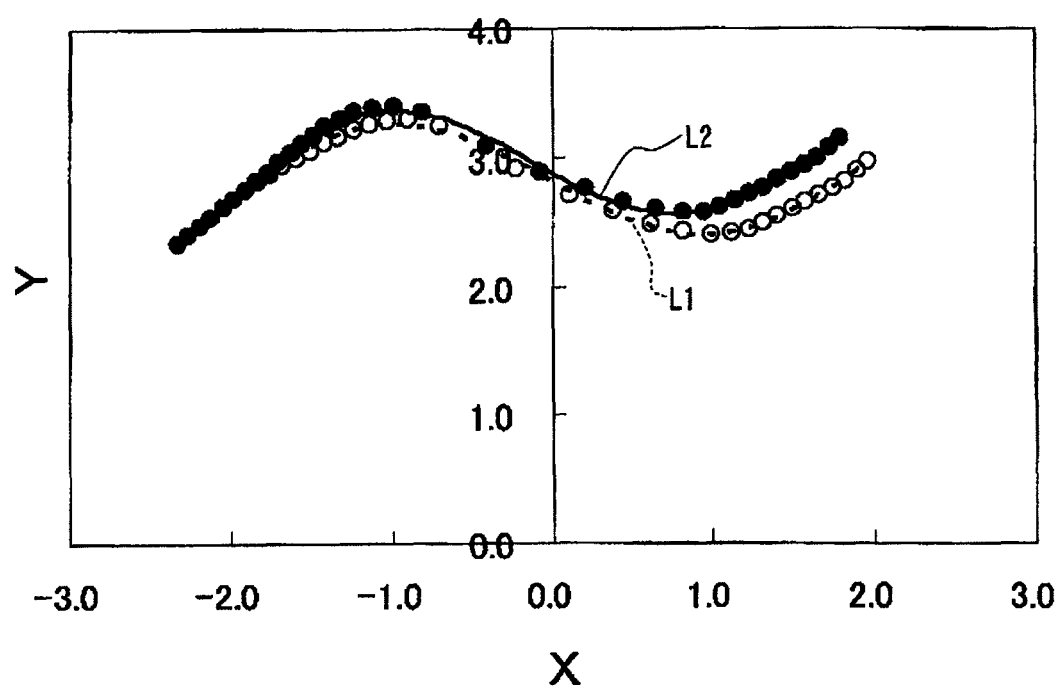
FIG. 12 is an explanatory view of the first proximity curve function and the second proximity curve function.
Figure 13:
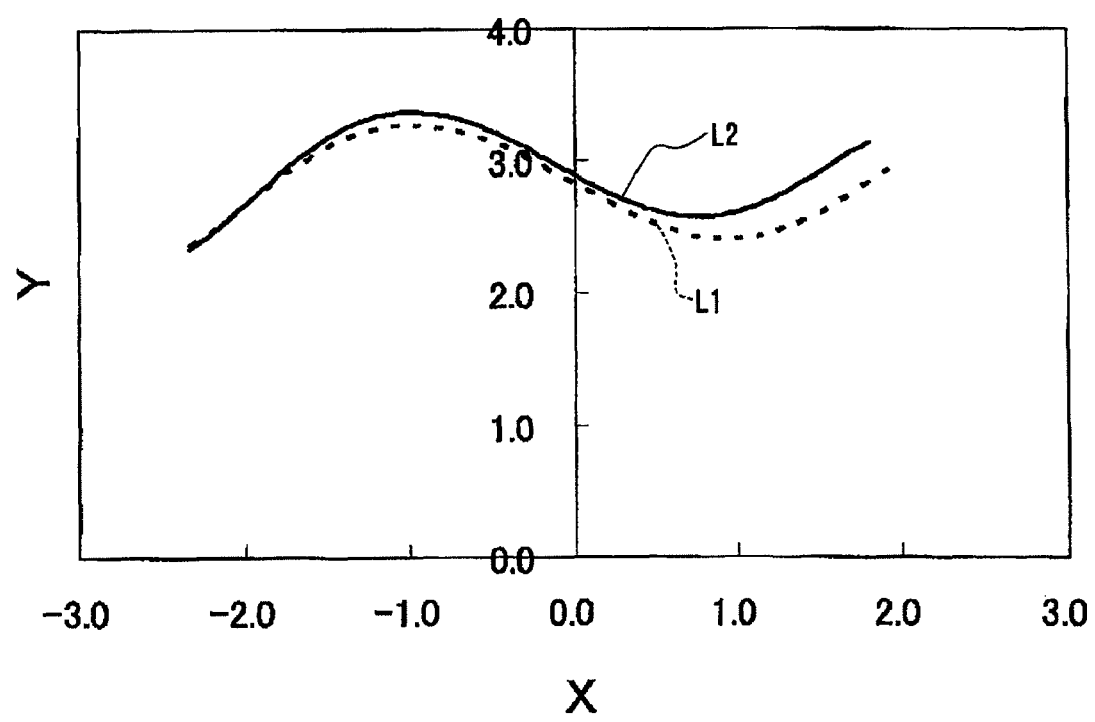
FIG. 13 is an explanatory view of the first proximity curve function and the second proximity curve function.

FIG. 13 shows a graph which is prepared by deleting the original rotary converted data and extracting only the first proximity curve function (L1) and the second proximity curve function (L2) from FIG. 12. When a quintic polynomial is used as an equation used for fitting, L1 and L2 are expressed by following functional forms respectively.

$$L1: Y = a_1 X^5 + b_1 X^4 + c_1 X^3 + d_1 X^2 + e_1 X + f_1 \qquad (6)$$

$$L2: Y = a_2 X^5 + b_2 X^4 + c_2 X^3 + d_2 X^2 + e_2 X + f_2 \qquad (7)$$

Here, $a_1$, $a_2$, $b_1$, $b_2$, $c_1$, $c_2$, $d_1$, $d_2$, $e_1$, $e_2$, $f_1$, $f_2$ are parameters determined corresponding to the fitting.

Next, the computer 10 generates the third proximity curve function by mirror-inverting the second proximity curve function L2 with respect to the Y axis in FIG. 13 (step T6' in FIG. 11). This Y-axis mirror-inversion operation is equivalent to an operation which substitutes X with −X in the above-mentioned equation (7). That is, this operation is equal to an operation to change symbols in front of parameters $a_2$, $c_2$, $e_2$ to "−".

L2' (Y axis mirror inversion):

$$Y = -a_2 X^5 + b_2 X^4 - c_2 X^3 + d_2 X^2 - e_2 X + f_2 \qquad (8)$$

Figure 14:
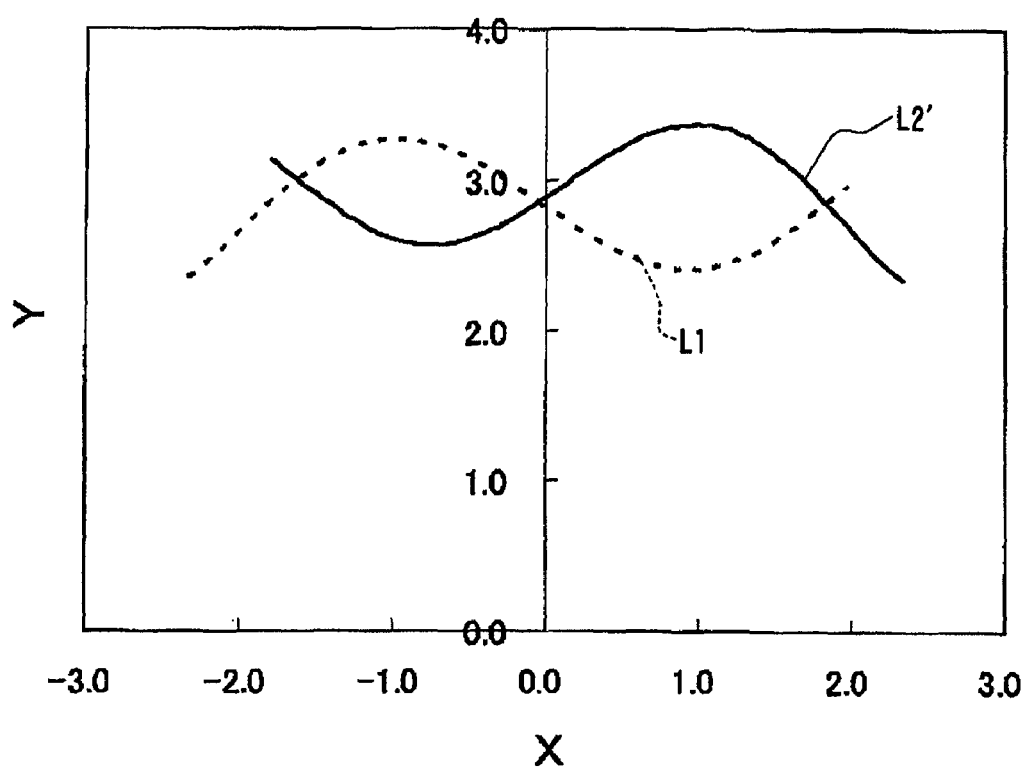
FIG. 14 is an explanatory view of the first proximity curve function and a third proximity curve function.
Figure 15:
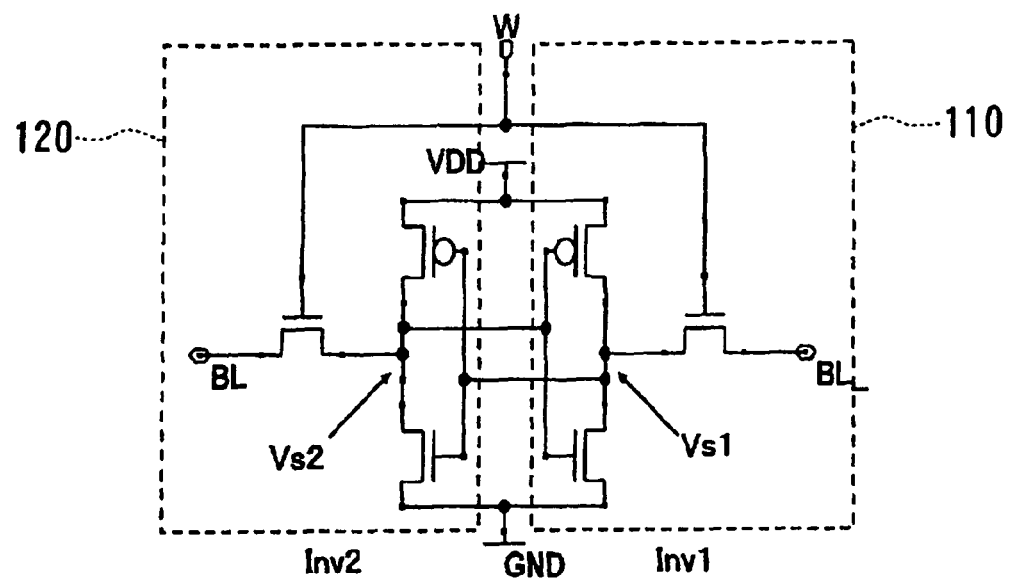
FIG. 15 is a circuit diagram of the SRAM memory cell.
Figure 16:
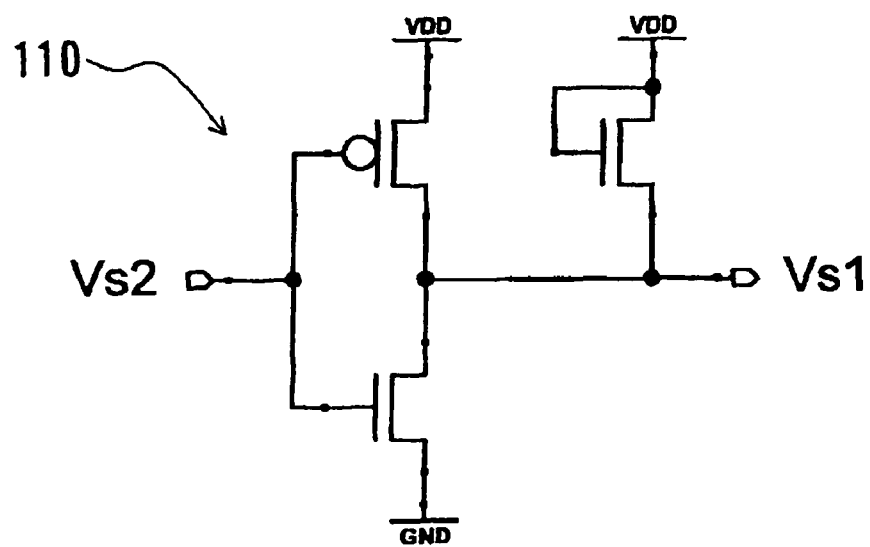
FIG. 16 is a circuit diagram of a first inverter.
Figure 17:
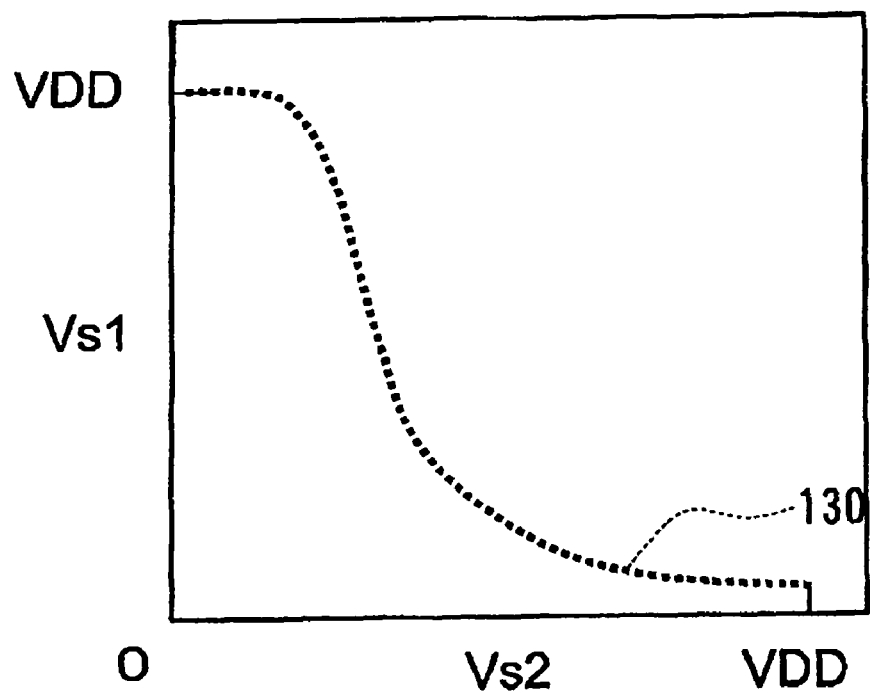
FIG. 17 is a graph showing first input/output characteristic data.
Figure 18:
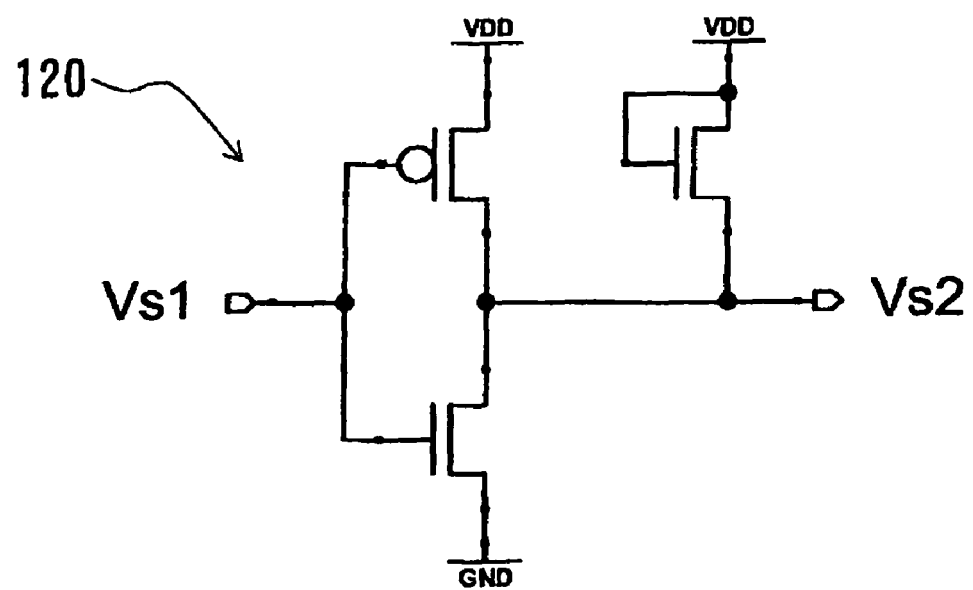
FIG. 18 is a circuit diagram of a second inverter.
Figure 19:
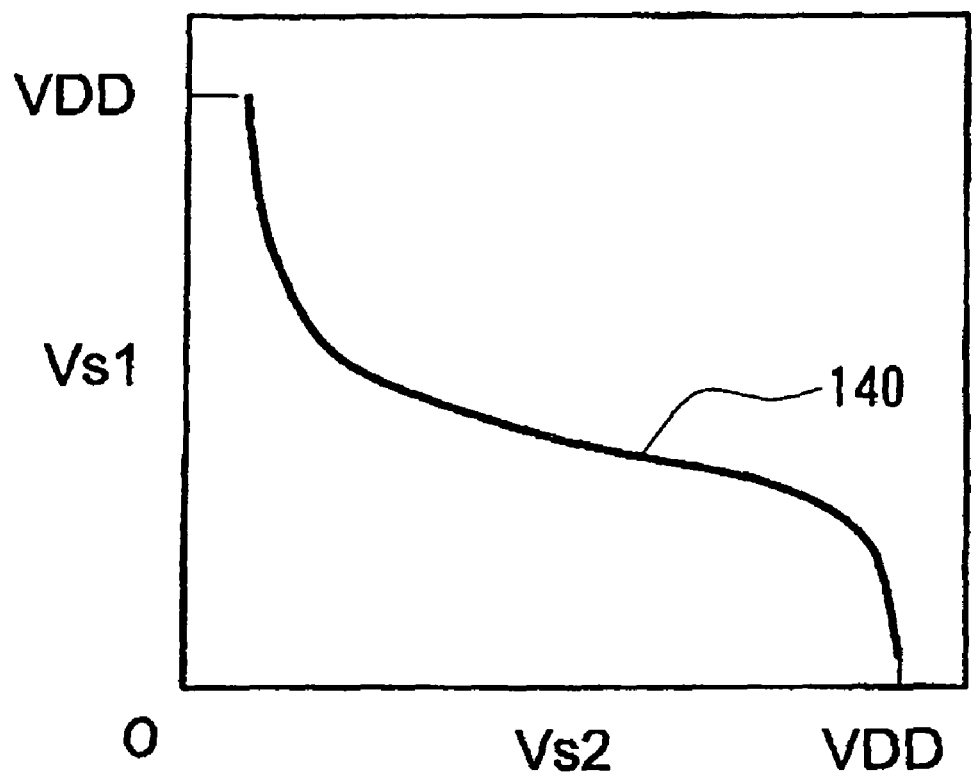
FIG. 19 is a graph showing second input/output characteristic data.
Figure 20:
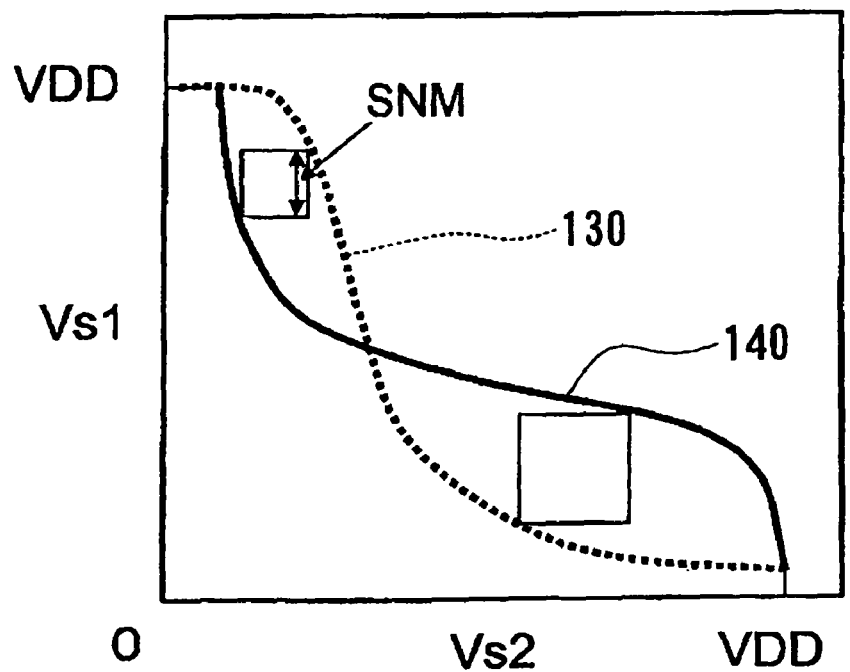
FIG. 20 is an explanatory view of a static noise margin.

FIG. 14 is a graph which is drawn by overlapping L2' obtained as a result of the Y-axis mirror inversion with L1.

Subsequent steps ranging from specifying of the difference curve function (step T7 in FIG. 11) to the calculation of the static noise margin are substantially equal to step T7 and ensuing steps in FIG. 8 and hence, the explanation of the steps is omitted.

In using the third embodiment, it is effective that, firstly, a large number of input/output characteristic data with respect to inverters are preliminarily collected by taking the influence such as characteristic irregularities into consideration, and processing up to step T6 in FIG. 11 are executed so as to obtain the above-mentioned equations (6), (7).

The Y-axis mirror inversion operation can be instantaneously performed using the equation (8). By performing the Y-axis mirror inversion operation using the equation (8), it is possible to describe the input/output characteristic of the inverters using only six parameters consisting of $a_1$ to $f_1$ and hence, it is possible to form basic and necessary minimum data base with respect to the SRAM memory cell circuit design with the small amount of data.

By taking out two arbitrary input/output characteristic data from the data base and by performing the processing in step T7 and ensuing steps in FIG. 11, the static noise margin with respect to various SRAM memory cells can be instantaneously calculated thus easily realizing the acquisition of an optimum memory cell circuit.

The invention claimed is:

1. A method for evaluating an SRAM memory cell which stores data by a flip-flop circuit which is constituted of a first inverter and a second inverter, the method for evaluating the SRAM memory cell comprising the steps of:
    obtaining first input/output characteristic data which is a characteristic of an output voltage for an input voltage in the first inverter;
    obtaining second input/output characteristic data by applying X-Y axis conversion to characteristic data of an output voltage for an input voltage in the second inverter;
    generating first rotary converted data by applying coordinate conversion which rotates a coordinate axis by 45 degrees to the first input/output characteristic data;
    generating second rotary converted data by applying coordinate conversion which rotates the coordinate axis by 45 degrees to the second input/output characteristic data;
    specifying a first proximity curve function obtained by fitting the first rotary converted data to a first proximity curve;
    specifying a second proximity curve function obtained by fitting the second rotary converted data to a second proximity curve;
    specifying a difference curve function which is the difference between the first proximity curve function and the second proximity curve function; and
    calculating a static noise margin by specifying a maximum value and a minimum value of the difference curve function, and also by dividing a smaller value out of an absolute value of the minimum value and the maximum value by a square root of 2.

2. A method for evaluating an SRAM memory cell which stores data by a flip-flop circuit which is constituted of a first inverter and a second inverter, the method for evaluating the SRAM memory cell comprising the steps of:
    obtaining first input/output characteristic data which is a characteristic of an output voltage for an input voltage in the first inverter;
    obtaining second input/output characteristic data which is a characteristic of an output voltage for an input voltage in the second inverter;
    generating first rotary converted data by applying coordinate conversion which rotates a coordinate axis by 45 degrees to the first input/output characteristic data;
    generating second rotary converted data by applying coordinate conversion which rotates the coordinate axis by 45 degrees to the second input/output characteristic data;
    generating Y-axis inverted data by mirror-inverting the second rotary converted data with respect to a Y axis;
    specifying a first proximity curve function obtained by fitting the first rotary converted data to a first proximity curve;
    specifying a second proximity curve function obtained by fitting the Y-axis inverted data to a second proximity curve;
    specifying a difference curve function which is the difference between the first proximity curve function and the second proximity curve function; and
    calculating a static noise margin by specifying a maximum value and a minimum value of the difference curve function, and also by dividing a smaller value out of an absolute value of the minimum value and the maximum value by a square root of 2.

3. A method for evaluating an SRAM memory cell which stores data by a flip-flop circuit which is constituted of a first inverter and a second inverter, the method for evaluating the SRAM memory cell comprising the steps of:

obtaining first input/output characteristic data which is a characteristic of an output voltage for an input voltage in the first inverter;

obtaining Second input/output characteristic data which is a characteristic of an output voltage for an input voltage in the second inverter;

generating first rotary converted data by applying coordinate conversion which rotates a coordinate axis by 45 degrees to the first input/output characteristic data;

generating second rotary converted data by applying coordinate conversion which rotates the coordinate axis by 45 degrees to the second input/output characteristic data;

specifying a first proximity curve function obtained by fitting the first rotary converted data to a first proximity curve;

specifying a second proximity curve function obtained by fitting the second rotary converted data to a second proximity curve;

obtaining a third proximity curve function which is a function generated by mirror-inverting the second proximity curve function with respect to a Y axis;

specifying a difference curve function which is the difference between the first proximity curve function and the third proximity curve function; and calculating a static noise margin by specifying a maximum value and a minimum value of the difference curve function, and also by dividing a smaller value out of an absolute value of the minimum value and the maximum value by a square root of 2.

4. A non-transitory computer readable recording medium which records an evaluation program of an SRAM memory cell which stores data by a flip-flop circuit constituted of a first inverter and a second inverter, wherein the evaluation program allows a computer executing the evaluation program to realize functions of evaluating the SRAM memory cell through the steps of:

obtaining first input/output characteristic data which is a characteristic of an output voltage for an input voltage in the first inverter;

obtaining second input/output characteristic data by applying X-Y axis conversion to characteristic data of an output voltage for an input voltage in the second inverter;

generating first rotary converted data by applying coordinate conversion which rotates a coordinate axis by 45 degrees to the first input/output characteristic data;

generating second rotary converted data by applying coordinate conversion which rotates the coordinate axis by 45 degrees to the second input/output characteristic data;

specifying a first proximity curve function obtained by fitting the first rotary converted data to a first proximity curve;

specifying a second proximity curve function obtained by fitting the second rotary converted data to a second proximity curve;

specifying a difference curve function which is the difference between the first proximity curve function and the second proximity curve function; and calculating a static noise margin by specifying a maximum value and a minimum value of the difference curve function, and also by dividing a smaller value out of an absolute value of the minimum value and the maximum value by a square root of 2.

5. A non-transitory computer readable recording medium which records an evaluation program of an SRAM memory cell which stores data by a flip-flop circuit constituted of a first inverter and a second inverter, wherein the evaluation program allows a computer executing the evaluation program to realize functions of evaluating the SRAM memory cell through the steps of:

obtaining first input/output characteristic data which is a characteristic of an output voltage for an input voltage in the first inverter;

obtaining second input/output characteristic data which is a characteristic of an output voltage for an input voltage in the second inverter;

generating first rotary converted data by applying coordinate conversion which rotates a coordinate axis by 45 degrees to the first input/output characteristic data;

generating second rotary converted data by applying coordinate conversion which rotates the coordinate axis by 45 degrees to the second input/output characteristic data;

generating Y-axis inverted data by mirror-inverting the second rotary converted data with respect to a Y axis;

specifying a first proximity curve function obtained by fitting the first rotary converted data to a first proximity curve;

specifying a second proximity curve function obtained by fitting the Y-axis inverted data to a second proximity curve;

specifying a difference curve function which is the difference between the first proximity curve function and the second proximity curve function; and calculating a static noise margin by specifying a maximum value and a minimum value of the difference curve function, and also by dividing a smaller value out of an absolute value of the minimum value and the maximum value by a square root of 2.

6. A non-transitory computer readable recording medium which records an evaluation program of an SRAM memory cell which stores data by a flip-flop circuit constituted of a first inverter and a second inverter, wherein the evaluation program allows a computer executing the evaluation program to realize functions of evaluating the SRAM memory cell through the steps of:

obtaining first input/output characteristic data which is a characteristic of an output voltage for an input voltage in the first inverter;

obtaining second input/output characteristic data which is a characteristic of an output voltage for an input voltage in the second inverter;

generating first rotary converted data by applying coordinate conversion which rotates a coordinate axis by 45 degrees to the first input/output characteristic data;

generating second rotary converted data by applying coordinate conversion which rotates the coordinate axis by 45 degrees to the second input/output characteristic data;

specifying a first proximity curve function obtained by fitting the first rotary converted data to a first proximity curve;

specifying a second proximity curve function obtained by fitting the second rotary converted data to a second proximity curve;

specifying a third proximity curve function which is a function generated by mirror-inverting the second proximity curve function with respect to a Y axis;

specifying a difference curve function which is the difference between the first proximity curve function and the third proximity curve function; and calculating a static noise margin by specifying a maximum value and a minimum value of the difference curve function, and also by dividing a smaller value out of an absolute value of the minimum value and the maximum value by a square root of 2.

7. A method for evaluating an SRAM memory cell which stores data by a flip-flop circuit which is constituted of a first inverter and a second inverter, the method for evaluating the SRAM memory cell comprising the steps of:
- obtaining first input/output characteristic data which is a characteristic of an output voltage for an input voltage in the first inverter;
- obtaining second input/output characteristic data which is a characteristic of an output voltage for an input voltage in the second inverter;
- generating first rotary converted data by applying coordinate conversion which rotates a coordinate axis by 45 degrees to the first input/output characteristic data;
- generating second rotary converted data by applying coordinate conversion which rotates the coordinate axis by 45 degrees to the second input/output characteristic data;
- specifying a first proximity curve function obtained by fitting the first rotary converted data to a first proximity curve;
- specifying a second proximity curve function based upon the second rotary converted data;
- specifying a difference curve function which is the difference between the first proximity curve function and another proximity curve function, the another proximity curve function being generated based on the second rotary converted data; and
- calculating a static noise margin by specifying a maximum value and a minimum value of the difference curve function, and also by dividing a smaller value out of an absolute value of the minimum value and the maximum value by a square root of 2.

8. The method of claim 7, wherein the second input/output characteristic data is obtained by applying X-Y axis conversion to said output voltage for said input voltage in the second inverter; wherein the second proximity curve function is obtained by fitting the second rotary converted data to a second proximity curve; and wherein said another proximity curve function is the second proximity curve function.

9. The method of claim 7, further comprising generating Y-axis inverted data by mirror-inverting the second rotary converted data with respect to a Y axis; wherein the second proximity curve function is obtained by fitting the Y-axis inverted data to a second proximity curve; and wherein said another proximity curve function is the second proximity curve function.

10. The method of claim 7, wherein the second proximity curve function is obtained by fitting the second rotary converted data to a second proximity curve; further comprising the step of obtaining a third proximity curve function which is a function generated by mirror-inverting the second proximity curve function with respect to a Y axis; and wherein said another proximity curve function is the third proximity curve function.

11. A non-transitory computer readable recording medium which records an evaluation program of an SRAM memory cell which stores data by a flip-flop circuit constituted of a first inverter and a second inverter, wherein the evaluation program allows a computer executing the evaluation program to realize functions of evaluating the SRAM memory cell through the steps of:
- obtaining first input/output characteristic data which is a characteristic of an output voltage for an input voltage in the first inverter;
- obtaining second input/output characteristic data which is a characteristic of an output voltage for an input voltage in the second inverter;
- generating first rotary converted data by applying coordinate conversion which rotates a coordinate axis by 45 degrees to the first input/output characteristic data;
- generating second rotary converted data by applying coordinate conversion which rotates the coordinate axis by 45 degrees to the second input/output characteristic data;
- specifying a first proximity curve function obtained by fitting the first rotary converted data to a first proximity curve;
- specifying a second proximity curve function based upon the second rotary converted data;
- specifying a difference curve function which is the difference between the first proximity curve function and another proximity curve function, the another proximity curve function being generated based on the second rotary converted data; and
- calculating a static noise margin by specifying a maximum value and a minimum value of the difference curve function, and also by dividing a smaller value out of an absolute value of the minimum value and the maximum value by a square root of 2.

12. The non-transitory computer readable recording medium of claim 11, wherein the second input/output characteristic data is obtained by applying X-Y axis conversion to the output voltage for the input voltage in the second inverter; wherein the second proximity curve function is obtained by fitting the second rotary converted data to a second proximity curve; and wherein said another proximity curve function is the second proximity curve function.

13. The non-transitory computer readable recording medium of claim 11, further comprising generating Y-axis inverted data by mirror-inverting the second rotary converted data with respect to a Y axis; wherein the second proximity curve function is obtained by fitting the Y-axis inverted data to a second proximity curve; and wherein said another proximity curve function is the second proximity curve function.

14. The non-transitory computer readable recording medium of claim 11, wherein the second proximity curve function is obtained by fitting the second rotary converted data to a second proximity curve; further comprising the step of obtaining a third proximity curve function which is a function generated by mirror-inverting the second proximity curve function with respect to a Y axis; and wherein said another proximity curve function is the third proximity curve function.

15. A method for evaluating an SRAM memory cell according to anyone of claims 3, 8, 6 and 10, wherein at least one of the proximity curve functions is a function expressed by a cubic or more polynomial.

16. A method for evaluating an SRAM memory cell according to anyone of claims 3, 8, 9 and 10, wherein at least one of the proximity curve functions is a function expressed by a quintic polynomial.

17. A non-transitory computer readable recording medium which records an evaluation program of an SRAM memory cell according to anyone of claims 6, 12, 13 and 14, wherein at least one of the proximity curve functions is a function expressed by a cubic or more polynomial.

18. A non-transitory computer readable recording medium which records an evaluation program of an SRAM memory cell according to anyone of claims 6, 12, 13 and 14, wherein at least one of the proximity curve functions is a function expressed by a quintic polynomial.

* * * * *